US006791441B2

United States Patent
Pillans et al.

(10) Patent No.: US 6,791,441 B2
(45) Date of Patent: Sep. 14, 2004

(54) MICRO-ELECTRO-MECHANICAL SWITCH, AND METHODS OF MAKING AND USING IT

(75) Inventors: Brandon W. Pillans, Dallas, TX (US); David I. Forehand, Plano, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/140,658

(22) Filed: May 7, 2002

(65) Prior Publication Data

US 2004/0124073 A1 Jul. 1, 2004

(51) Int. Cl.$^7$ .............................................. H01H 51/22
(52) U.S. Cl. ........................................ 335/78; 361/233
(58) Field of Search .......................... 335/78–86, 124, 335/128; 257/414–415, 417, 421, 424, 531, 427; 200/181; 361/231–3

(56) References Cited

U.S. PATENT DOCUMENTS

| | | | |
|---|---|---|---|
| 4,743,722 A | 5/1988 | Oelsch | |
| 5,619,061 A | 4/1997 | Goldsmith et al. | |
| 5,652,559 A | 7/1997 | Saia et al. | |
| 5,665,997 A | 9/1997 | Weaver et al. | |
| 6,100,477 A | * 8/2000 | Randall et al. | 200/181 |
| 6,229,683 B1 | * 5/2001 | Goodwin-Johansson | 361/233 |
| 6,452,124 B1 | * 9/2002 | York et al. | 200/181 |
| 2002/0018334 A1 | 2/2002 | Hill et al. | |

FOREIGN PATENT DOCUMENTS

| | | |
|---|---|---|
| EP | 0 709 911 A | 5/1996 |
| WO | WO 98/21734 | 5/1998 |

OTHER PUBLICATIONS

Chan, et al., "Comprehensive Static Characterization of Vertical Electrostatically Actuated Polysilicon Beams", 1999 IEEE Design & Test of Computers, Oct.–Dec. 1999, pp. 58–65.

U.S. Ser. No. 09/866,205, filed May 25, 2001, entitled "Membrane for Micro–Electro–Mechanical Switch, and Methods of Making and Using It", by inventors Shea Chen, Brandon W. Pillans, John C. Ehmke and Zhimin J. Yao, 37 pages of specification, 6 pages of drawings.

* cited by examiner

Primary Examiner—Lincoln Donovan
(74) Attorney, Agent, or Firm—Baker Botts L.L.P.

(57) ABSTRACT

A micro-electro-mechanical (MEMS) switch (10, 110) has an electrode (22, 122) covered by a dielectric layer (23, 123), and has a flexible conductive membrane (31, 131) which moves between positions spaced from and engaging the dielectric layer. At least one of the membrane and dielectric layer has a textured surface (138) that engages the other thereof in the actuated position. The textured surface reduces the area of physical contact through which electric charge from the membrane can tunnel into and become trapped within the dielectric layer. This reduces the amount of trapped charge that could act to latch the membrane in its actuated position, which in turn effects a significant increase in the operational lifetime of the switch.

9 Claims, 3 Drawing Sheets

MICRO-ELECTRO-MECHANICAL SWITCH, AND METHODS OF MAKING AND USING IT

TECHNICAL FIELD OF THE INVENTION

This invention relates in general to switches and, more particularly, to micro-electro-mechanical switches having flexible membranes.

BACKGROUND OF THE INVENTION

One existing type of switch is a radio frequency (RF) micro-electro-mechanical switch (MEMS). This existing type of switch has a substrate with two spaced and conductive posts thereon. A conductive part is provided on the substrate between the posts, and is covered by a layer of a dielectric material. A flexible and electrically conductive membrane extends between the posts, so that a central portion of the membrane is located above the conductive part on the substrate. An RF signal is applied to one of the conductive part and the membrane.

In the deactuated state of the switch, the membrane is spaced above both the conductive part and the dielectric layer covering it. In order to actuate the switch, a direct current (DC) bias voltage is applied between the membrane and the conductive part. This bias voltage produces charges on the membrane and the conductive part, and the charges cause the membrane and conductive part to be electrostatically attracted to each other. This attraction causes the membrane to flex, so that a central portion thereof moves downwardly until it contacts the top of the dielectric layer on the conductive part. This is the actuated position of the membrane.

In this actuated state of the switch, the spacing between the membrane and the conductive part is less than in the deactuated state. Therefore, in the actuated state, the capacitive coupling between the membrane and the conductive part is significantly larger than in the deactuated state. Consequently, in the actuated state, the RF signal traveling through one of the membrane and conductive part is capacitively coupled substantially in its entirety to the other thereof.

In order to deactuate the switch, the DC bias voltage is turned off. The inherent resilience of the membrane then returns the membrane to its original position, which represents the deactuated state of the switch. Because the capacitive coupling between the membrane and conductive part is much lower in the deactuated state, the RF signal traveling through one of the membrane and capacitive part experiences little or no capacitive coupling to the other thereof.

Although existing switches of this type have been generally adequate for their intended purposes, they have not been satisfactory in all respects. One problem is that, when the membrane is contacting the dielectric layer in the actuated state of the switch, electric charge from the membrane can tunnel into and become trapped in the dielectric layer. As a result, and due to long recombination times in the dielectric, the amount of this trapped charge in the dielectric increases progressively over time.

The progressively increasing amount of trapped charge exerts a progressively increasing attractive force on the membrane. When the membrane is in its actuated position, this attractive force tends to resist movement of the membrane away from its actuated position toward its deactuated position. The amount of trapped charge can eventually increase to the point where the attractive force exerted on the membrane by the trapped charge is in excess of the inherent resilient force of the membrane which is urging the membrane to return to its deactuated position. As a result, the membrane becomes trapped in its actuated position, and the switch is no longer capable of carrying out a switching function. This is considered a failure of the switch, and is associated with an undesirably short operational lifetime for the switch. In this regard, an RF MEMS switch of this type should be capable of trillions of switching cycles before a failure occurs due to fatigue in the metal of the membrane, but trapped charge in the dielectric usually results in failure after only millions of switching cycles.

There are many applications in which a switching function can be implemented using either a field effect transistor (FET) switch or an RF MEMS switch. However, due in significant part to the dielectric charging problem discussed above, the operational lifetime of existing MEMS switches is significantly shorter than the operational lifetime of commercially available FET switches. Consequently, FET switches are currently favored over MEMS switches for these applications.

Prior attempts have been made to solve the dielectric charging problem. One approach was to change the properties of the dielectric material so as to modify the extent to which the dielectric material is "leaky". For example, by adding more silicon to silicon nitride used for the dielectric material, the conductivity of the dielectric material increases, and then it becomes easier for the trapped charges to recombine in a manner which neutralizes them. However, this approach also increases the power consumption of the MEMS switch, and has not been shown to provide a significant increase in its operational lifetime.

Another prior approach to the dielectric charging problem is to alter the waveform used for the DC bias voltage. For example, lowering the actuation voltage reduces the amount of charge which tunnels into the dielectric material, and thus reduces the rate at which the amount of trapped charge within the dielectric material can increase. Further, the slope of the release waveform can be decreased, so as to give the trapped charges more time to recombine. These types of changes to the actuation waveform can produce a significant increase in the operational lifetime of a MEMS switch. However, they also significantly increase the switching time of the switch, for example by a factor of approximately 20, which in turn renders such a MEMS switch highly undesirable for many applications that involve high switching speeds.

In the design of MEMS switches, a traditional design goal has been to try to maximize the capacitance ratio of the switch, which is the ratio of the capacitance between the membrane and conductive part in the actuated state to the corresponding capacitance in the deactuated state. In an effort to maximize the capacitance in the actuated state, pre-existing MEMS switch designs attempt to position the membrane as close as possible to the conductive part in the actuated state of the switch, which in turn means that the dielectric layer separating them needs to be relatively thin. Consequently, the surfaces of the membrane and dielectric layer which engage each other have traditionally been intentionally polished or otherwise fabricated to make them as smooth as possible, so that both surfaces have their entire areas in direct physical contact with each other when the membrane is in its actuated position, thereby positioning as much of the membrane as possible in very close proximity to the conductive part.

SUMMARY OF THE INVENTION

From the foregoing, it may be appreciated that a need has arisen for a method and apparatus for making and operating a switch of the type having a flexible membrane, in a manner so that the switch has a significantly increased operational lifetime. According to the present invention, a method and apparatus are provided to address this need.

More specifically, according to one form of the invention, a switch includes a base having a first section which includes an electrically conductive part, and also includes a membrane having first and second ends supported at spaced locations on the base, and having between the ends a second section which includes an electrically conductive portion. The membrane is capable of resiliently flexing so as to move between first and second positions, the conductive part and the conductive portion being physically closer in the second position than in the first position. One of the first and second sections has a textured surface, and the other thereof has a further surface which faces the textured surface, the textured surface having mutually exclusive first and second portions which are respectively in physical contact with and free of physical contact with the further surface when the membrane is in the second position. The first portion of the textured surface has an area which is substantially less than a total area of the textured surface.

According to a different form of the invention, a switching method uses a switch that includes a base having a first section with an electrically conductive part, and that includes a membrane having first and second ends supported at spaced locations on the base, and having between the ends a second section which includes an electrically conductive portion, where one of the first and second sections has a textured surface and the other thereof has a further surface which faces the textured surface. The method includes: responding to an applied voltage between the conductive part and the conductive portion by resiliently flexing the membrane so that the conductive part moves closer to the conductive portion as the membrane moves from a first position to a second position. This includes causing mutually exclusive first and second portions of the textured surface to respectively be in physical contact with and free of physical contact with the further surface when the membrane is in the second position, the first portion of the textured surface having an area which is substantially less than a total area of the textured surface.

According to still another form of the invention, a method of fabricating a switch includes: forming on a base a first section which includes an electrically conductive part; forming a resiliently flexible membrane having first and second ends engaging spaced portions of the base disposed on opposite sides of the first section, and having between the ends a second section which includes an electrically conductive portion, the membrane being capable of resiliently flexing so as to move between first and second positions so that the conductive part and the conductive portion are physically closer in the second position than in the first position; and forming on one of the first and second sections a textured surface and on the other thereof a further surfaces which faces the textured surface, the textured surface having mutually exclusive first and second portions which are respectively in physical contact with and free of physical contact with the further surface when the membrane is in the second position, the first portion of the textured surface having an area which is substantially less than a total area of the textured surface.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
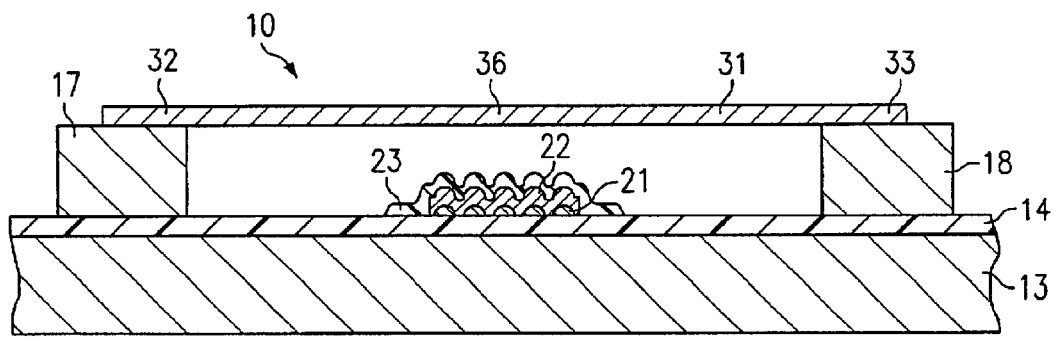
FIG. 1 is a diagrammatic fragmentary sectional side view of an apparatus which includes a micro-electro-mechanical switch (MEMS) that embodies aspects of the present invention.

FIG. 1 is a diagrammatic fragmentary sectional side view of an apparatus which includes a micro-electro-mechanical switch (MEMS) 10, the switch 10 embodying aspects of the present invention. The drawings, including FIG. 1, are diagrammatic and not to scale, in order to present the switch 10 in a manner which facilitates a clear understanding of the present invention.

With reference to FIG. 1, the switch 10 includes a silicon semiconductor substrate 13 having on an upper side thereof an oxide layer 14. Although the substrate 13 is a made of silicon in this disclosed embodiment, it could alternatively be made of some other suitable material, such as gallium arsenide (GaAs), or a suitable alumina. Similarly, the oxide layer 14 is silicon dioxide in this disclosed embodiment, but could alternatively be some other suitable material.

Two posts 17 and 18 are provided at spaced locations on the oxide layer 14, and are each made of a conductive material. In this embodiment the posts are made of gold, but they could alternatively be made of some other suitable conductive material. A plurality of diagrammatically depicted nodules 21 are provided on the upper surface of the oxide layer 14, at a location intermediate the posts 17 and 18, in order to create a degree of roughness or texture on this part of the top surface of the oxide layer 14. In the embodiment of FIG. 1, the nodules 21 are made of silicon titanium (SiTi), and have a silicon to titanium ratio of about 5:1. However, the nodules 21 could alternatively be made from some other suitable material. In the embodiment of FIG. 1, the nodules 21 have a vertical height of approximately 100 to 500 nm, but could alternatively have some other suitable height.

Instead of using the silicon substrate with nodules thereon, it would alternatively be possible to omit the nodules and to use a substrate of some other material, such as alumina, which has a top surface inherently rougher than the top surface of silicon. The electrode and dielectric layer would then conform to the rough surface on top of the alumina in order to create a textured surface on top of the dielectric layer. Although alumina has previously been used in pre-existing MEMS switches, it has customarily been highly polished so as to eliminate any significant roughness, in an effort to maximize the capacitance ratio, as discussed earlier.

An electrically conductive electrode 22 serves as a transmission line, and is elongated in a direction perpendicular to the plane of FIG. 1. In the embodiment of FIG. 1, the electrode 22 is made of gold, but it could alternatively be made from some other suitable material. A central portion of the electrode 22, which is visible in FIG. 1, is approximately 300 to 400 nm thick, and extends over the nodules 21 and the adjacent portions of the top surface of the oxide layer 14. Consequently, in view of the vertical height of the nodules 21, the electrode 22 conforms generally to the shape of an upwardly facing surface defined by surface portions on top of the nodules 21 and oxide layer 14. Thus, the top surface of the central portion of the electrode 22 has a degree of roughness or texture.

This central portion of the electrode 22 is covered by a dielectric layer 23. In the disclosed embodiment, the dielectric layer 23 is made of silicon nitride, and has a thickness of approximately 100 to 300 nm. The dielectric layer 23 conforms in shape to the top surface of the electrode 22, and thus the top surface of the electrode 23 has a degree of roughness or texture. The substrate 13, oxide layer 14, posts 17–18, nodules 21, electrode 22 and dielectric layer 23 can be collectively referred to as a base portion of the switch 10.

A conductive membrane 31 extends between the upper ends of the posts 17 and 18. In the disclosed embodiment, the membrane 31 is made of a known aluminum alloy, and in fact could be made of any suitable material that is commonly used to fabricate membranes in MEMS switches. The membrane 31 has ends 32 and 33, which are each fixedly supported on the top portion of a respective one of the posts 17 and 18. The membrane 31 has, between its ends 32 and 33, a central portion 36 which is disposed directly above the electrode 22 and the dielectric layer 23.

Figure 2:
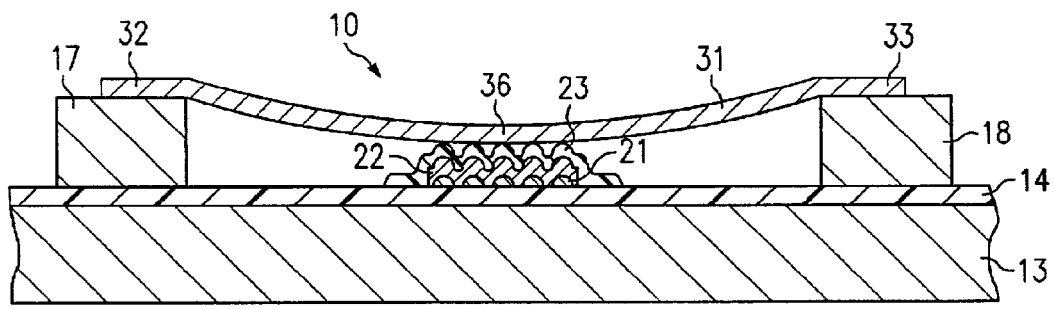
FIG. 2 is a diagrammatic fragmentary sectional side view similar to FIG. 1, but showing the switch of FIG. 1 in a different operational state.

The membrane 31 is approximately planar in the view of FIG. 1, but is capable of flexing so that its central portion 36 moves downwardly until it contacts the textured top surface of the dielectric layer 23. This flexed position is shown in FIG. 2, which is a diagrammatic fragmentary sectional side view showing the same structure as FIG. 1, but in a different operational state.

During operational use of the switch 10, a radio frequency (RF) signal having a frequency in the range of approximately 300 MHz to 90 GHz is caused to travel through one of the membrane 31 and the electrode 22. More specifically, the RF signal may be traveling from the post 17 through the membrane 31 to the post 18. Alternatively, the RF signal may be traveling through the electrode 22 in a direction perpendicular to the plane of FIGS. 1 and 2.

Actuation of the switch 10 is carried out under control of a direct current (DC) bias voltage, which is applied between the membrane 31 and the electrode 22 by a control circuit of a type which is well-known in the art, and which is therefore not illustrated and described. This bias voltage can also be referred to as a pull-in voltage ($V_p$). When the bias voltage is not applied to the switch 10, the membrane 31 is in the position shown in FIG. 1. As discussed above, an RF signal will be passing through one of the membrane 31 and the electrode 22. For convenience in the discussion which follows, it will be assumed that the RF signal is passing through the electrode 22. When the membrane 31 is in the deactuated position of FIG. 1, the RF signal traveling through the electrode 22 will pass through the switch 10 and continue traveling through the electrode 22, with no significant coupling of this RF signal from the electrode 22 over to the membrane 31.

In order to actuate the switch 10, a DC bias voltage (pull-in voltage $V_p$) is applied between the electrode 22 and the membrane 31. This bias voltage produces charges on the membrane 31 and on the electrode 22, which in turn produce an electrostatic attractive force that urges the central portion 36 of the membrane 31 toward the electrode 22. This attractive force causes the membrane 31 to flex downwardly, so that its central portion 36 moves toward the electrode 22. The membrane 31 flexes until its central portion 36 engages the textured top surface of the dielectric layer 23, as shown in FIG. 2. This is the actuated position of the membrane. In this position, the capacitive coupling between the electrode 22 and the central portion 36 of the membrane 31 is approximately 100 times greater than when the membrane 31 is in the deactuated position shown in FIG. 1. Consequently, the RF signal traveling through the electrode 22 will be coupled substantially in its entirety from the electrode 22 over into the membrane 31, where it will tend to have two components that travel away from the central portion 36 of the membrane in opposite directions, toward each of the posts 17 and 18. Alternatively, if the RF signal had been traveling through the membrane 31 from the post 17 to the post 18, the RF signal would have been coupled substantially in its entirety from the central portion 36 of the membrane over to the electrode 22, where it would tend to have two components that travel away from the switch 10 in respective opposite directions through the electrode 22.

Once the membrane 31 has reached the actuated position shown in FIG. 2, the not-illustrated control circuit may optionally reduce the DC bias voltage (pull-in voltage $V_p$) to a standby or hold value. The standby or hold value is less than the voltage that was needed to initiate downward movement of the membrane 31 from the position shown in FIG. 1, but is sufficient to maintain the membrane 31 in the actuated position of FIG. 2, once the membrane has reached this actuated position.

While the membrane 31 is in the actuated position of FIG. 2, the textured top surface of the dielectric layer 23 causes the actual physical contact between the dielectric layer 23 and electrode 31 to be limited to a number of spaced contact regions that are each relatively small in area. In other words, the total area of physical contact between the dielectric layer 23 and the membrane 31 is substantially less than would be the case if the dielectric 23 had a smooth and flat top surface which, in its entirety, was in physical contact with the smooth and approximately flat underside of the central portion 36 of the membrane 31. Since the operative coupling between the membrane 31 and electrode 22 involves capacitive coupling, rather than direct physical contact, reducing the total amount of direct physical contact between them does not have a significant effect on the operation of the switch 10.

When a textured surface of the type shown in FIG. 1 is used, the capacitance between the membrane 31 and the electrode 22 in the actuated state of FIG. 2 may be slightly less that it would be if the dielectric layer 23 had a traditional flat top surface. Consequently, the ratio of the capacitance for the actuated state of FIG. 2 to the capacitance for the deactuated state of FIG. 1 may be slightly less than when the dielectric layer 23 has a traditional flat surface. However, this small reduction in the capacitance ratio is negligible at higher frequencies, and any minor disadvantage is outweighed by the fact that a significant advantage is obtained from use of the textured surface. In particular, by using the textured surface to reduce the total area of actual physical contact between the membrane 31 and the dielectric layer 23, there is less total area of physical contact through which electric charge from the membrane 31 can pass, and this in turn reduces the amount of charge that can tunnel into and become trapped in the dielectric layer 23. This means that the rate at which trapped charge can build up in the dielectric layer 23 is substantially lower for the switch of FIGS. 1–2 than for pre-existing switches.

As a result, it takes much longer for the switch 10 to reach a state where the amount of trapped charge in the dielectric layer can attract the membrane 31 with a force sufficiently large to prevent the switch 10 from deactuating when the DC bias voltage (pull-in voltage $V_p$) is terminated. Therefore, the effective operational lifetime of the switch 10 is substantially longer than for pre-existing switches which do not have the textured surface. In fact, the textured surface extends the operational lifetime of the switch so much that the limiting factor on operational lifetime becomes physical fatigue and/or failure of the membrane 31, rather than trapping of the membrane 31 due to trapped charges in the dielectric layer 23. In this regard, switch 10 will have an operational lifetime that can be 1,000 to 1,000,000,000 times longer that the operational lifetime of comparable pre-existing switches that lack the textured surface.

A secondary advantage of the textured surface is that, by reducing the total area of physical contact between the membrane 31 and the dielectric layer 23, there is a reduction in Van Der Walls forces which tend to cause attraction between the membrane 31 and dielectric layer 23, and which thus resist movement of the membrane 31 away from the dielectric layer 23.

In order to deactivate the switch 10, the not-illustrated control circuit terminates the DC bias voltage (pull-in voltage $V_p$) that is being applied between the membrane 21 and the electrode 22. The inherent resilience of the flexible membrane 31 produces a relatively strong restoring force, which causes the central portion 36 of the membrane to move upwardly away from the dielectric layer 23 and the electrode 22, until the membrane reaches the position shown in FIG. 1.

Figure 3:
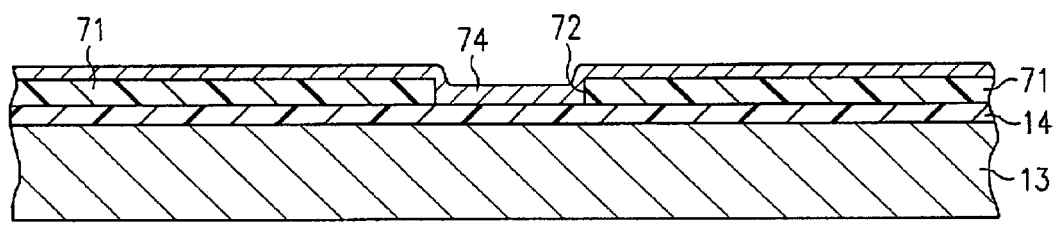
FIG. 3 is a diagrammatic fragmentary sectional side view showing a portion of the switch of FIG. 1, at an intermediate point during its fabrication.

FIG. 3 is a diagrammatic fragmentary sectional side view of part of the switch 10 of FIG. 1, showing the switch at an intermediate point during its fabrication. Fabrication of the switch 10 begins with provision of the silicon substrate 13, and then the silicon oxide layer 14 is grown on the substrate 13 using known techniques.

Next, a layer 71 of photoresist is applied over the oxide layer 14. The photoresist layer 71 is then patterned and etched using known techniques, so as to define through the layer 71 an opening 72 in the region where the electrode 22 (FIG. 1) will eventually be formed. Next, a layer 74 of an aluminum alloy is sputtered over the layer 71, so that a portion of the layer 74 engages the oxide layer 14 within the opening 72 through the photoresist 71. In the disclosed embodiment, the aluminum alloy layer 71 is approximately 300 nm thick, and contains approximately 98.8% aluminum (Al), 1% silicon (Si), and 0.2% titanium (Ti). The layer 74 is then wet etched, in order to remove the aluminum through aluminum leach. The aluminum leach that occurs during the wet etch does not remove the silicon and titanium, thereby leaving the SiTi nodules 21 (FIG. 1), which are approximately 100 to 500 nm in vertical height. Next, the photoresist layer 71 is removed in a known manner. Any SiTi nodules present on the layer 71 itself are removed with the layer 71, thereby leaving only the SiTi nodules 21 located directly on the oxide layer 14, as shown diagrammatically in FIG. 1.

Figure 4:
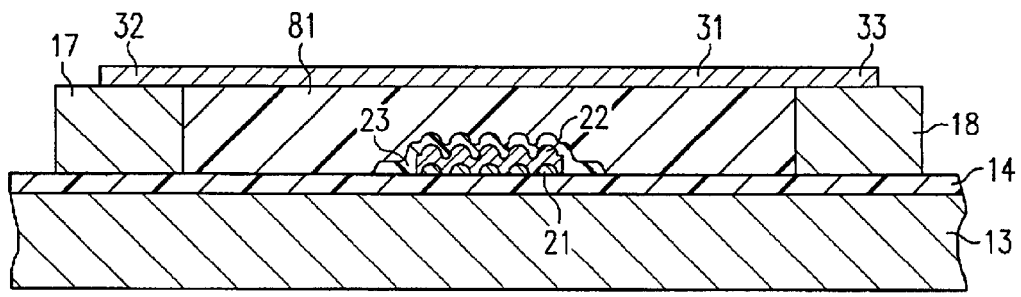
FIG. 4 is a diagrammatic fragmentary sectional side view similar to FIG. 3, but showing part of the switch of FIG. 1 at a later point during fabrication of the switch.

FIG. 4 is a diagrammatic fragmentary sectional side view similar to FIG. 3, but showing part of the switch at a later point during its fabrication. With reference to FIG. 4, the next step in the fabrication of the switch is to form the electrode 22 over the nodules 21 and the oxide layer 14, for example by depositing a layer of gold and then carrying out a patterned etch. After that, the dielectric layer 23 is formed, for example by depositing a layer of silicon nitride and then carrying out a patterned etch.

Next, the posts 17 and 18 are formed, by depositing a layer of gold, and then carrying out a patterned etch so to leave just the posts 17–18. Then, a spacer layer 81 is formed over the oxide layer 14, dielectric layer 23 and posts 17–18. The spacer layer 76 is a photoresist material of a type known to persons skilled in the art. The spacer layer 76 is patterned, etched, and/or planarized, in order to give it a desired shape and thickness. After that, a layer of a known aluminum alloy is deposited over the spacer layer 76, the posts 17–18 and the oxide layer 14, and is patterned and etched in order form the membrane 31. At this point, the structure has the configuration which is shown in FIG. 4.

Next, an etch procedure referred to as a membrane release etch is carried out, in order to remove the spacer layer 76 in its entirety. The membrane release etch may, for example, be a plasma etch of a known type, or any other suitable etch that will attack the material of the photoresist forming the spacer layer 76. This etch leaves the membrane 31 suspended on the posts 17–18 by its ends 32 and 33. This is the finished configuration of the switch 10, which is shown in FIG. 1.

Figure 5:
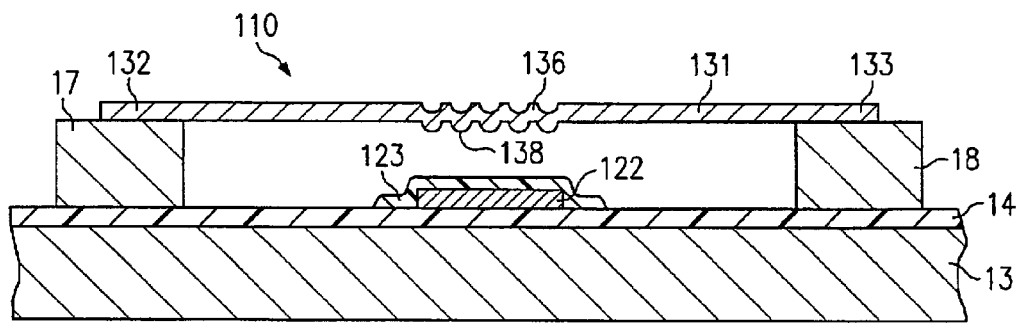
FIG. 5 is a diagrammatic fragmentary sectional side view similar to FIG. 1, but showing a micro-electro-mechanical switch (MEMS) which is an alternative embodiment of the switch of FIG. 1.

FIG. 5 is a diagrammatic fragmentary sectional side view of an apparatus that includes a micro-electro-mechanical switch (MEMS) 110, which is an alternative embodiment of the switch 10 of FIG. 1. Except for differences which are described below, the switch 110 is generally similar the switch 10, and identical parts are identified by the same reference numerals.

The switch 110 includes a substrate 13, oxide layer 14, and posts 17 and 18, which are equivalent to their counterparts in the embodiment of FIG. 1. An electrode 122 is provided on the oxide layer 14 intermediate the posts 17–18, and is covered by a dielectric layer 123. It will be noted that the SiTi nodules 21 in FIG. 1, are omitted from the switch 110 of FIG. 5. Consequently, the electrode 122 is disposed directly on a flat top surface of the oxide layer 14, and the electrode 122 thus has an approximately flat upper surface. A portion of the top surface of the dielectric layer 123 which is located directly above the electrode 122 is also flat, rather than textured. Aside from this, the electrode 122 and dielectric layer 123 are generally equivalent to the electrode 22 and dielectric layer 23 in the switch 10 of FIG. 1.

In FIG. 5, an electrically conductive membrane 131 extends between the upper ends of the posts 17 and 18, and has ends 132 and 133 which are each fixedly supported on top of a respective one of the posts 17 and 18. The membrane 131 is generally equivalent to the membrane 31 in the switch 10 of FIG. 1, except that the membrane 131 has a textured surface 138 on the underside of a central portion 136 thereof. The textured surface 138 includes several projections or bosses that project downwardly toward the electrode 122 and the dielectric layer 123, and which are spaced from each other.

Figure 6:
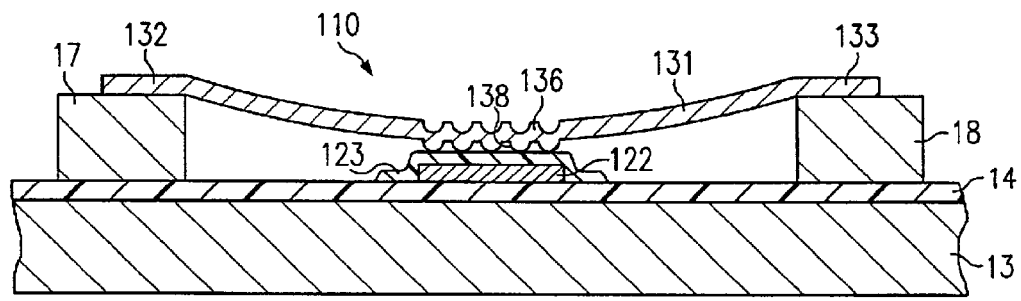
FIG. 6 is a diagrammatic fragmentary sectional side view similar to FIG. 5, but showing the switch of FIG. 5 in a different operational state.

The membrane 131 can resiliently flex from the deactuated position shown in FIG. 5 to an actuated position. In this regard, FIG. 6 is a diagrammatic fragmentary sectional side view showing the switch 110 of FIG. 5, but with the membrane 131 in its actuated position. In this actuated position, the dielectric layer 123 engages only spaced portions of the textured surface 138 which are located at the ends of the bosses. Consequently, the total area of actual physical contact between the membrane 131 and the dielectric layer 123 is less than would be the case if the flat surface of the dielectric layer was engaging a flat surface on the membrane.

The switch 110 of FIGS. 5–6 operates in a manner similar to the operation of the switch 10 of FIGS. 1–2. Accordingly, it is believed to be unnecessary to provide a separate detailed explanation of the operation of the switch 110.

Figure 7:
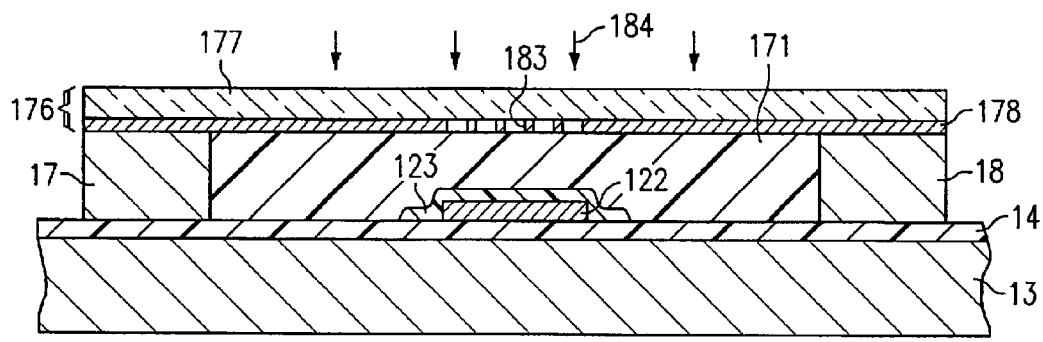
FIG. 7 is a diagrammatic fragmentary sectional side view showing a portion of the switch of FIG. 5, at an intermediate point during its fabrication.

FIG. 7 is a diagrammatic fragmentary sectional side view of part of the switch 110 of FIG. 5, at an intermediate stage during fabrication of the switch 110. With reference to FIG. 7, fabrication of the switch 110 begins with provision of the silicon substrate 13, and then the oxide layer 14 is grown on the silicon substrate 13. After that, the electrode 142 is formed on the oxide layer 14, for example by depositing a layer of gold and then carrying out a patterned etch. Next, the dielectric layer 123 is formed, for example by depositing a layer of silicon nitride, and then carrying out a patterned etch.

Next, the posts 17 and 18 are formed, for example by depositing a layer of gold and then carrying out a patterned etch that removes unwanted material, so as to leave just the posts 17 and 18. Then, a spacer layer 171 is formed over the oxide layer 14, the dielectric layer 123, and the posts 17–18. The spacer layer 176 is a photoresist material of a known type, which is patterned and etched in order to give it a desired shape. The resulting structure may be planarized, so that the top surfaces of the posts 17 and 18 are substantially flush with the top surface of the spacer layer 171.

A mask 176 is then placed over the partially completed device. In FIG. 7, the mask 176 is shown resting on the top surfaces of the spacer layer 171 and the posts 17–18, but the mask 176 may alternatively be spaced slightly above these surfaces. The mask 176 includes a glass layer 177 which is transparent to ultraviolet radiation, and a chrome layer 178 which is provided on the underside of the glass layer 177. The chrome layer 178 is non-transmissive to ultraviolet radiation. The chrome layer 178 has, in a central portion thereof immediately above electrode 122 and the dielectric layer 123, a cluster of spaced openings, one of which is identified by reference numeral 183. In the disclosed embodiment, the openings 183 are circular and each have a diameter in the range of approximately 100 nm to 500 nm, but they could alternatively have some other suitable shape or size. Using alignment techniques known to those skilled in the art, the mask 176 is accurately positioned with respect to the structure being fabricated, so that the cluster of openings 183 is accurately centered above the electrode 122 and the dielectric layer 123.

Next, the structure shown in FIG. 7 is exposed to ultraviolet radiation for a predetermined time interval, as indicted diagrammatically by arrows 184. Radiation which impinges on the chrome layer 178 will be either reflected or absorbed. The remaining radiation will pass through the openings 183, and will "expose" spaced regions of the photoresist material located adjacent the top surface of the spacer layer 171.

Figure 8:
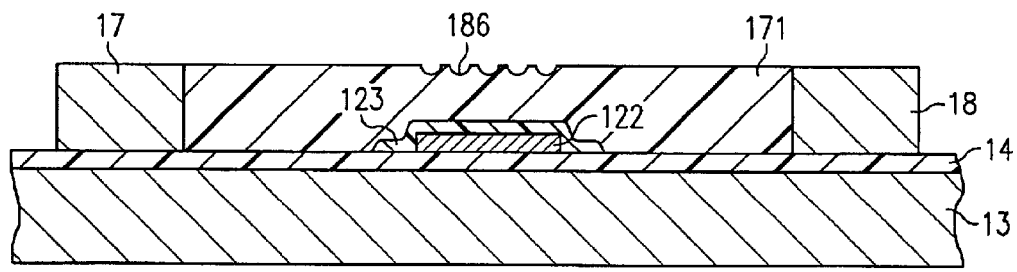
FIG. 8 is a diagrammatic fragmentary sectional side view similar to FIG. 7, but showing part of the switch of FIG. 5 at a later point during fabrication of the switch.
Figure 9:
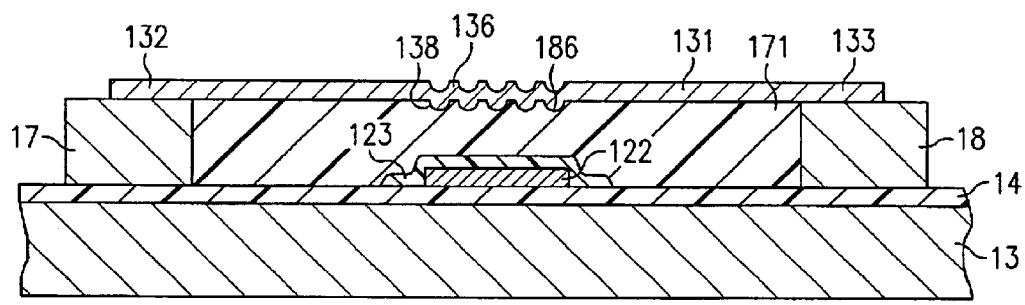
FIG. 9 is a diagrammatic fragmentary sectional side view similar to FIG. 8, but showing the switch of FIG. 5 at still a later point during its fabrication.

The mask 176 is then removed, and the spacer layer 171 is etched using known techniques, so as to remove material of the spacer layer 171 which has been exposed to light. The result is spaced recesses or dimples in the top surface of the spacer layer 171. In this regard, FIG. 8 is a diagrammatic fragmentary sectional side view similar to FIG. 7, but showing part of the switch 110 at a later stage in its fabrication. In FIG. 8, reference numeral 186 designates one of the recesses that are created in the top surface of the spacer layer 171 by the etch procedure. The strength and duration of the etch procedure are selected to give the recesses 186 a desired depth. In the disclosed embodiment, the recesses 186 have a depth of approximately 100 nm, but it would be possible for the recesses to alternatively have a larger or smaller depth.

Next, the membrane 131 is formed by depositing a layer of a known aluminum alloy over the spacer layer 171, the posts 17–18, and the oxide layer 14. This layer of aluminum alloy is then patterned and etched, in order to form the membrane 131. The central portion 136 of the membrane 131 conforms in shape to the top surface of the spacer layer 171, including the recesses 186 therein. Thus, the portion of the top surface having the recesses 186 creates the textured surface 138 on the underside of the central portion 136 of the membrane 131.

Thereafter, a known etch procedure referred to as a membrane release etch is carried out, in order to remove the spacer layer 171 in its entirety. This etch leaves the membrane 131 suspended on the posts 17–18 by its ends 132 and 133. This is the finished configuration of the switch 110, which is shown in FIG. 5.

The present invention provides a number of technical advantages. One such technical advantage is that a MEMS switch embodying the present invention has a useful lifetime which is several orders of magnitude better than pre-existing MEMS switches. In this regard, the provision of a textured surface on at least one of the membrane and dielectric layer reduces the total area of physical contact between the membrane and dielectric layer. This in turn reduces the amount of charge from the membrane which can tunnel into and become trapped in the dielectric layer, thereby decreasing the voltage which charge trapped in the dielectric can exert on the membrane in a manner that could eventually latch the membrane in its actuated position.

Due to the textured surface, the operational lifetime of the switch begins to approach the operational lifetime of certain field effect transistor (FET) switches, thereby permitting a MEMS switch which embodies the invention to compete commercially for use in applications that traditionally were restricted to FET switches. A further advantage is that the textured surface tends to reduce the extent to which Van Der Walls forces and/or contamination can resist movement of the membrane away from the dielectric layer when the switch is deactuated.

Although selected embodiments have been illustrated and described in detail, it will be understood that various substitutions and alterations are possible without departing from the spirit and scope of the present invention, as defined by the following claims.

What is claim is:

1. An apparatus comprising a micro-electro-mechanical switch which includes:
   a base having a first section which includes an electrically conductive part;
   a membrane having first and second ends supported at spaced locations on said base, and having between said ends a second section which includes an electrically conductive portion, said membrane being capable of resiliently flexing so as to move between first and second positions, said conductive part and said conductive portion being physically closer in said second position than in said first position, one of said first and second sections having a textured surface and the other thereof having a further surface which faces said textured surface, said textured surface having mutually exclusive first and second portions which are respectively in physical contact with and free of physical contact with said further surface when said membrane is in said second position, said first portion of said textured surface having an area which is substantially less than a total area of said textured surface; and wherein one of said first and second sections includes a dielectric material having thereon one of said textured and further surfaces, said one of said textured and further surfaces being formed of the dielectric material, the other of said textured and further surfaces being provided on one of said conductive part and said conductive portion.

2. An apparatus according to claim 1, wherein said first portion of said textured surface is defined by a plurality of separate regions of said textured surface which are spaced from each other.

3. An apparatus comprising a micro-electro-mechanical switch which includes:

a base having a first section which includes an electrically conductive part;

a membrane having first and second ends supported at spaced locations on said base, and having between said ends a second section which includes an electrically conductive portion, said membrane being capable of resiliently flexing so as to move between first and second positions, said conductive part and said conductive portion being physically closer in said second position than in said first position, one of said first and second sections having a textured surface and the other thereof having a further surface which faces said textured surface, said textured surface having mutually exclusive first and second portions which are respectively in physical contact with and free of physical contact with said further surface when said membrane is in said second position, said first portion of said textured surface having an area which is substantially less than a total area of said textured surface;

wherein said second section includes a dielectric material having said textured surface on a side thereof facing said first section, said textured surface being formed of the dielectric material, said conductive portion being disposed on an opposite side of said dielectric material from said first section; and wherein said further surface is provided on said conductive part of said membrane.

4. An apparatus according to claim 3, wherein said conductive portion has a textured surface on a side thereof nearest said first section; and wherein said dielectric material is a dielectric layer provided over and conforming a shape of said textured surface on said conductive portion so as to define on said dielectric layer said textured surface having said first and second portions.

5. An apparatus according to claim 3, wherein said base includes a portion having a textured surface on a side thereof nearest said first section;

wherein said conductive portion is a conductive layer provided over and conforming to a shape of said textured surface on said portion of said base so as to define on a side of said conductive layer facing said first section a textured surface; and wherein said dielectric material is a dielectric layer provided over and conforming to said textured surface on said conductive part so as to define on said dielectric layer said textured surface having said first and second portions.

6. An apparatus according to claim 5, wherein said portion of said base includes a base surface which faces said first section, and includes a plurality of nodules fixedly provided on said base surface, said textured surface on said portion of said base being defined by surface portions disposed on said nodules and said layer.

7. An apparatus comprising a micro-electro-mechanical switch which includes:

a base having a first section which includes an electrically conductive part;

a membrane having first and second ends supported at spaced locations on said base, and having between said ends a second section which includes an electrically conductive portion, said membrane being capable of resiliently flexing so as to move between first and second positions, said conductive part and said conductive portion being physically closer in said second position than in said first position, one of said first and second sections having a textured surface and the other thereof having a further surface which faces said textured surface, said textured surface having mutually exclusive first and second portions which are respectively in physical contact with and free of physical contact with said further surface when said membrane is in said second position, said first portion of said textured surface having an area which is substantially less than a total area of said textured surface;

wherein said second section includes a dielectric material having said further surface on a side thereof facing said first section, said further surface being formed of the dielectric material, said conductive portion being disposed on an opposite side of said dielectric material from said first section; and wherein said textured surface is provided on said conductive part.

8. An apparatus according to claim 3, wherein said first portion of said textured surface is defined by a plurality of separate regions of said textured surface which are spaced from each other.

9. An apparatus according to claim 7, wherein said first portion of said textured surface is defined by a plurality of separate regions of said textured surface which are spaced from each other.

* * * * *

UNITED STATES PATENT AND TRADEMARK OFFICE
CERTIFICATE OF CORRECTION

PATENT NO. : 6,791,441 B2
DATED : September 14, 2004
INVENTOR(S) : Brandon W. Pillans et al.

It is certified that error appears in the above-identified patent and that said Letters Patent is hereby corrected as shown below:

Title page,
Item [56], References Cited, U.S. PATENT DOCUMENTS, before "4,743,722" please insert -- 4,423,294 A 12/1983 Walser, et al. --.

Column 3,
Line 55, after "further" delete "surfaces" and insert -- surface --.

Signed and Sealed this

Twenty-sixth Day of April, 2005

JON W. DUDAS
*Director of the United States Patent and Trademark Office*